United States Patent

Casey et al.

[11] Patent Number: 5,759,669
[45] Date of Patent: Jun. 2, 1998

[54] APPARATUS AND METHOD FOR SCREENING GREEN SHEET WITH VIA HOLE USING POROUS BACKING MATERIAL

[75] Inventors: Jon Alfred Casey, Poughkeepsie; Cynthia Jeane Calli; Darren T. Cook, both of Newburgh; David B. Goland, Croton-on-Hudson; John Ulrich Knickerbocker, Hopewell Junction; Mark Joseph LaPlante, Walden; David Clifford Long, Wappingers Falls; Daniel Scott Mackin, Pleasant Valley; Kathleen Mary McGuire, Walkill; Keith Colin O'Neil, Hughsonville; Kevin Michael Prettyman, Holmes; Michael Thomas Puchalski, Carmel; Joseph Christopher Saltarelli, Poughkeepsie; Candace Anne Sullivan, Pleasant Valley, all of N.Y.

[73] Assignee: International Business Machines Corporation, Armonk, N.Y.

[21] Appl. No.: 577,179

[22] Filed: Dec. 22, 1995

[51] Int. Cl.[6] .................. B29C 37/00; B32B 3/24
[52] U.S. Cl. .................. 428/139; 428/131; 428/137; 428/138; 428/145; 428/901; 156/89.12; 156/89.28; 264/651; 264/614; 264/619; 264/660; 264/672; 427/97; 427/96; 427/261; 427/191; 427/372.2; 29/851
[58] Field of Search .................. 428/131, 137, 428/138, 139, 195, 901; 427/96, 97, 191, 261, 372.2; 156/89.12, 89.28; 29/851; 264/672, 651, 614, 619, 660

[56] References Cited

U.S. PATENT DOCUMENTS

| 3,953,562 | 4/1976 | Hait et al. | 264/63 |
| 4,259,061 | 3/1981 | Nubetsky | 432/13 |
| 5,130,067 | 7/1992 | Flaitz et al. | 264/60 |
| 5,139,712 | 8/1992 | Hese et al. | 264/41 |
| 5,198,162 | 3/1993 | Park et al. | 264/49 |
| 5,207,968 | 5/1993 | Phelps et al. | 264/344 |
| 5,248,461 | 9/1993 | Pluyter et al. | 264/41 |
| 5,273,657 | 12/1993 | Nakashima et al. | 210/640 |
| 5,290,504 | 3/1994 | Milkovich et al. | 264/342 RE |
| 5,387,474 | 2/1995 | Mikeska et al. | 428/688 |

OTHER PUBLICATIONS

K. S. Desai et al., "Backing Material for MLC Screening", IBM Technical Disclosure Bulletin, vol. 24 No. 10 p. 5119 Mar. 1982.

*Primary Examiner*—William Watkins
*Attorney, Agent, or Firm*—Aziz M. Ahsan

[57] ABSTRACT

The present invention relates generally to a new apparatus and method for screening using porous backing material. More particularly, the invention encompasses an apparatus that uses a porous backing material which is adhered to a green sheet during the screening process. Basically, a backing layer having a very high porosity is adhered to a green sheet, while the green sheet is screened. During the drying process of the green sheet some of the screening fluids are absorbed by the porous backing layer, which allows the screened vias of the green sheet to have a smooth surface.

19 Claims, 1 Drawing Sheet

APPARATUS AND METHOD FOR SCREENING GREEN SHEET WITH VIA HOLE USING POROUS BACKING MATERIAL

FIELD OF THE INVENTION

The present invention relates generally to a new apparatus and method for screening using porous backing material. More particularly, the invention encompasses an apparatus that uses a porous backing material which is adhered to a green sheet during the screening process. Basically, a backing layer having a very high porosity is adhered to a green sheet, while the green sheet is screened.

BACKGROUND OF THE INVENTION

Semiconductor devices are becoming smaller and more dense with the evolution of new technology. Therefore, there is a pressure for this industry to constantly make improvements and innovation in this technology. The semiconductor manufacturers are therefore constantly being challenged to improve the quality of their products by identifying and eliminating defects and to make improvements where necessary. Whereas significant improvements are being made to eliminate systematic defects by reducing process variability. Process improvements alone are not sufficient to eliminate all the random defects which effect both yield and reliability. Historically, inspection techniques have been employed to improve product failure rates to acceptable levels by culling out many of these random defects.

Similarly, in the fabrication of ceramic substrates, such as, multilayer ceramic (MLC) substrates, the formation of vias is critical to the electrical performance of the final substrate. Vias can be formed by a number of methods. The most popular method of forming vias in ceramic green sheets is by punching or drilling holes through the individual green sheets and filling these holes with a metallurgical paste that is electrically conductive.

These individual green sheets are then laminated by methods well known in the art and the green sheet laminates are then processed through a furnace. After sintering of the laminated green sheets and the subsequent formation of a ceramic substrate, the vias containing the metal form an electrical path between the various layers on the substrate.

U.S. Pat. No. 5,387,474 (Mikeska), is directed to green ceramic composite and method for making such composites. Basically, an unfired ceramic tape or part with or without metallization is sandwiched between two flexible constraining layers, and this sandwiched structure is then processed through a furnace. For some applications the bottom flexible constraining layer could be replaced with a pre-fired ceramic substrate with or without metallization.

U.S. Pat. No. 5,139,712 (Hese), discloses a method of producing microfiltration membranes from aromatic polyamides, in which the pore sizes are between 0.05 and 10.00 microns.

U.S. Pat. No. 5,198,162 (Park), discloses microporous polymeric films of high porosity. The film has a porosity of more than 50 percent by volume and typically the porosity of the film is between 60 and 70 percent by volume.

U.S. Pat. No. 5,248,461 (Pluyter), discloses a process of making microporous films of UHMWPE (Ultra-High Molecular Weight Polyethylene).

U.S. Pat. No. 5,273,657 (Nakashima), discloses a process of preparing modified porous membranes. These modified porous membranes can be used in filtration processes, as well as, reverse osmosis, gas separation, vapor permeation or pervaporation.

IBM Technical Disclosure Bulletin, "Backing Material For MLC Screening", Vol. 24, No. 10, page 5119 (March 1982), the disclosure of which is incorporated herein by reference, teaches that backing material is typically employed in the MLC (Multi-Layer Ceramic) screening processes. It also teaches that the backing material prevents paste at the via holes from contacting the screening nest. And, that the backing material should also exhibit porosity or perforations for vacuum hold down of the green sheet and it should have non-porous edges for vacuum handling. Additionally, it also discloses that the backing material utilized for this prior art screening processes should exhibit low static charge susceptibility, is smooth and planar, and is compatible with the screening paste used, and also exhibits dimensional stability.

In most of the prior art processes pits and/or depression are commonly formed during the screening process. The formation of pits or depressions in the green sheet screening process is basically associated with volumetric changes during the drying of the paste. During the drying cycle the solvents are removed and the paste volume decreases. Additionally, pits are also formed if the interface between the paste and the backing film is somehow degraded. However, if the paste adheres to the backing film and it easily separates after drying then pitting is minimized. This fixed interface forces the volumetric shrinkage to occur at the opposite surface of the green sheet which is the actual bottom surface of the top layer of the completed substrate.

The present invention relates to a new method and apparatus for the fabrication of green sheets for MLC applications which contain a flush, pit-free via surface. This is accomplished by applying a temporary backing layer having a very high porosity to the back of a green sheet and then the green sheet is screened by any of the prior art methods. An adhesive force between the backing layer and the paste forms due to capillary action and prevents the movement of the green sheet relative to the backing film, thus maintaining a good interface between the backing film and via/paste. After the screening process has been performed the excess fluid in the via is absorbed by the high porosity backing layer and subsequently the backing layer is peeled off, leaving behind a green ceramic sheet with pit-free vias.

PURPOSES AND SUMMARY OF THE INVENTION

The invention is a novel method and an apparatus for using a high porosity backing layer which is temporarily adhered to a green sheet/via during the green sheet screening process.

Therefore, one purpose of this invention is to provide an apparatus and a method that will provide good adhesion between the green sheet and the backing layer during the screening process.

Another purpose of this invention is to provide for a pit free via formation in a green sheet.

Still another purpose of this invention is to have an economical way of making pit free vias in a green sheets.

Therefore, in one aspect this invention comprises a process for screening a green sheet using at least one porous backing layer, comprising the steps of:

(a) placing a green sheet with at least one hole on said at least one porous backing layer, such that said backing layer entirely covers said at least one hole and forms a bi-layer.

(b) screening said bi-layer with at least one metallic paste, such that said paste fills said at least one hole in said green sheet, (c) placing said bi-layer in a paste drying environment, such that said porous backing layer absorbs fluids present in said paste, and (d) removing said backing layer and thereby completing the screening of a green sheet using at least one porous backing layer.

In another aspect this invention comprises a bi-layer green sheet structure, comprising, (a) at least one green sheet with at least one via hole, (b) at least one porous backing layer supporting said at least one green sheet, such that said at least one via hole is entirely covered by said at least one porous backing layer, and (c) metallic paste, wherein upon screening said green sheet with said metallic paste, said paste makes direct contact with the portion of said backing layer covering said via hole so that excess solvents in said paste are absorbed by said backing layer during the drying of said paste.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

The prior art process of filling the via holes in most cases involves extruding a metal filled paste into the via holes either by using a stencil type mask or a mesh type mask. Since the metallurgical paste contains solvents which are required to achieve the necessary rheological behavior for screening, the paste must be dried after the vias have been filled in order to remove the above mentioned solvents.

During the drying of the metallurgical pastes, the solvents are removed and significant shrinkage of the paste can occur. This shrinkage is associated with the volumetric change resulting from capillary drying stresses during the solvent removal process. If allowed to occur freely, the shrinkage of the paste typically results in a structure that contains depressions and pits at the top and bottom surfaces of the via/green sheet.

Figure 1:
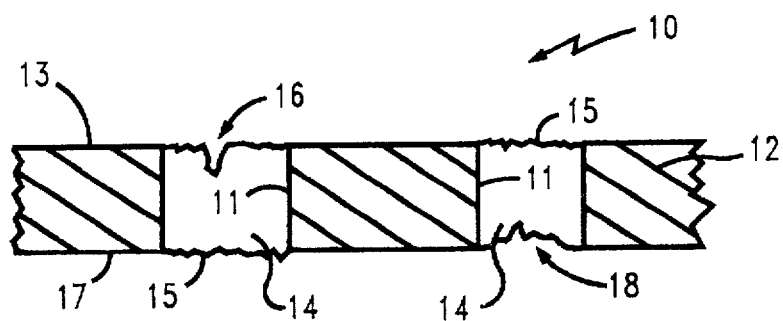
FIG. 1, illustrates a prior art green ceramic sheet having vias which have pits and depressions.

FIG. 1, shows a cross-section of a prior art ceramic substrate 10, having ceramic sheet 12, that has gone through a sintering cycle and has vias 14, which contain pits 16, on the upper surface 13, and depressions 18, on the bottom surface 17, of the ceramic sheet 12. The surface indicated by numeral 15, is a smooth via surface 15, which is presently available by the prior art methods and processes.

These depressions 18, and pits 16, can create significant problems if their size is sufficient to cause poor electrical and/or mechanical connection between the layers 12, during lamination or if the pits 16, are present at the surface after lamination.

Furthermore, open pits 16, at the surface of the vias 14, can trap fluids and debris after sintering, which could result in significant processing problems of the fired or sintered substrate. Ideally, a flush, dense surface of the paste in the via is required to achieve maximum electrical performance of MLC substrates, as shown by the surface 15.

Several techniques can be used to reduce or eliminate capillary stress and shrinkage associated with solvent removal during drying. These techniques typically involve altering the surface energies of the system by using surfactants or super critical drying processes. However, these techniques are typically not suitable to the processing of green sheets for MLC applications. As such, a technique which can control the localized drying of the paste at the free surfaces such that pits or depressions are eliminated, without affecting the green sheet, would be very beneficial.

However, one solution to this problem could be to simply apply an adhesive (not shown) to a backing film, in order to aid in the maintenance of contact between the green sheet 12, and the backing film. While this approach is technically feasible, removal of the adhered backing film, after screening could result in significant damage to the green sheet 12, and the paste, similar to that shown in FIG. 1. This of course negates the usefulness of this approach.

Thus there is a need to invent a technique to reduce or eliminate the formation of drying pits or depressions, that may form in a green sheet.

Figure 2:
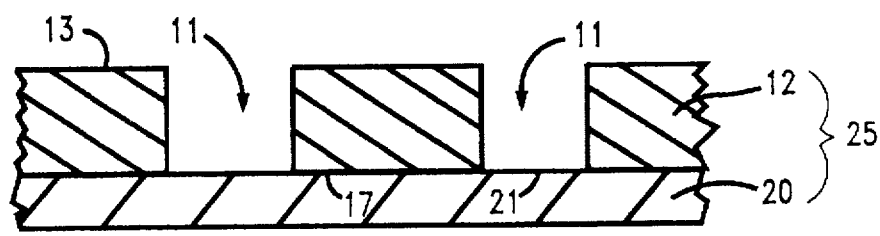
FIG. 2, illustrates a side view of the preferred embodiment of this invention.

FIG. 2, illustrates the preferred embodiment of this invention. A standard ceramic green sheet 12, having holes or openings 11, is placed onto a backing film or layer 20, to form a bi-layer 25.

The backing film 20, has a high degree of porosity. The porous backing film 20, contains a pore structure and surface chemistry that allows for the paste and paste solvents to wet the surface of the porous film 20, and extract solvents out of the paste and into the porous film 20. The backing film 20, has an upper surface 21, that is preferably very smooth and flat to help assist in the formation of corresponding smooth and flat surfaces and to prevent any extraneous formation of deforming or undulating structures.

The material for the porous backing layer or film 20, could be made from a group comprising latex, poly (alkenes), polyester, polymeric material, polyimide, rubber, to name a few. An insulative polymer by the tradename SOLUPOR, could also be used as a backing layer. However, it should be understood that any backing layer that is used, must have a high porosity.

Any movement between the green sheet 12, and the backing film 20, during the actual screening operation could result in a degradation to the metallurgical paste/backing film interface and therefore should be avoided at all cost.

Furthermore, maintaining a good interface between the green sheet 12, and the backing film 20, is very critical during the drying of the paste, because once the interface is compromised, the paste is free to shrink away from the backing film 20, resulting in drying pits. Thus, the better the interface between the backing film 20, and the green sheet/paste 12, the lower the level of drying pits.

Figure 3:
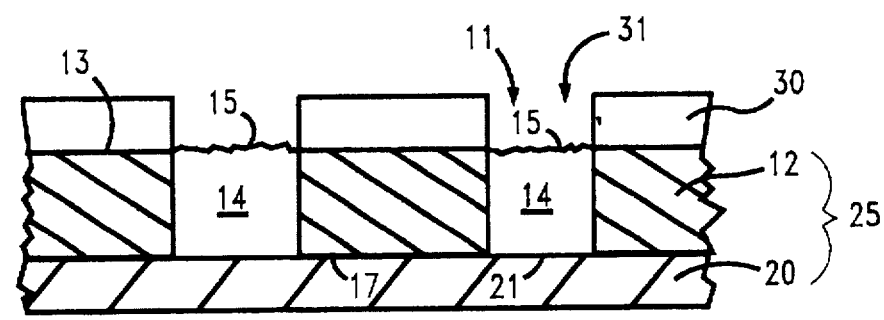
FIG. 3, illustrates a side view of the invention of FIG. 2, after a screening mask has been placed over the green sheet.

The bi-layer 25, containing the green sheet 12, and the porous backing film 20, is now ready for the next processing step, as shown in FIG. 3. Screening of the green sheet 12, is performed using standard processes, such as, placing a stencil type screening mask 30, over the surface 13, of the green sheet 12, and screening metallic paste 14, through an opening 31, in the mask 30, into the via opening or hole 11, of the green sheet 12, as shown in FIG. 3. Care should be taken that the paste 14, does not overflow out of the via opening 11.

The screening paste 14, is typically selected from a group comprising, copper, gold, molybdenum, nickel, platinum, silver, tungsten or alloys thereof, to name a few.

After the screening process, the bi-layer 25, containing the metallurgical paste 14, is dried using standard drying methods and conditions.

The adhesion between the green sheet 12, and the backing film 20, must occur during the drying operation so that little or no movement occurs between the green sheet 12, on the backing film 20. This reduces or eliminates separation of the metallic paste 14, from the backing film 20, during the drying of the paste 14. Sufficient adhesion of the metallic paste 14, to the backing film 20, typically will occur to prevent separation between the two, as long as the interface is not mechanically compromised by sheet movement. The adhesion between the backing film and wet paste is the result of capillary forces associated with the extraction of paste solvents through the porous backing film. In fact, removal of the backing film 20, prior to the complete drying of the paste can result in damage to the via 14, due to pulling out of dried paste 14.

Figure 4:
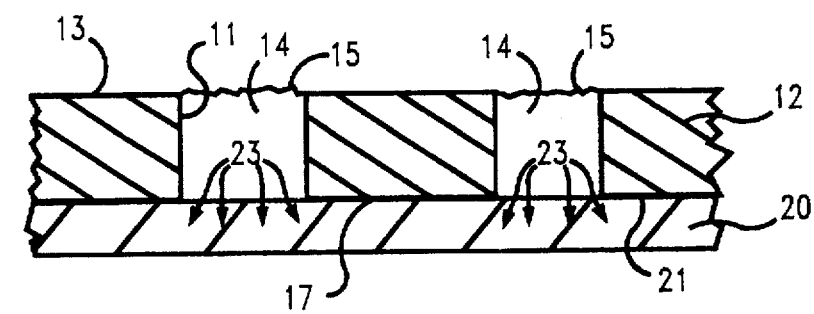
FIG. 4, shows the direction of absorption of some of the solvents by the inventive backing layer of this invention, after the via holes in the green sheet have been filled with the metallic paste.

In FIG. 4, a schematic representation is shown of the drying process utilizing the porous backing film 20. Shown by arrows 23, are the areas where the trapped solvents in the metallic paste will be absorbed by the backing film 20, during the drying process. As shown in FIG. 4, the screening mask 30, has already been removed. It is well known in the art that some of the solvents will penetrate into the green sheet 12, through the walls of the via 11, since the green sheets are typically quite porous. However, in this case the solvents will take a path of least resistance, and solvents will penetrate into the porous backing film 20.

The solvent extraction through the porous film creates several critical conditions. First, the solvent removal into the porous film creates a localized flux of material towards the surface of the paste. This prevents the migration of materials away from the surface which can result in pits and depressions. Secondly, the solvent removal creates a localized area of material that is higher in viscosity than the surrounding paste since the solvent content is much lower in this region due to the solvent extraction. This localized region of high viscosity acts to skin over the surface of the via and form a dried, flush surface. Lastly, as the solvents are extracted into the porous film, a capillary force is established between the paste and the porous film which results in a significant adhesion between the paste and the porous film. This adhesive force prevents or reduces incidental movement of the interface during drying which aids in the formation of a flush surface after drying and porous film removal. Integrity of the paste/backing film interface is critical to the elimination of depression and pits.

In order to achieve the above requirements, the material selection and pore structure of the porous film are extremely critical. Pore size and wetting behavior control the capillary pressure and solvent extraction properties of materials. Additionally, if a material for the porous film is selected that has too much wetting and adhesion between itself and the paste, the paste can be torn out of the via after drying when the porous film is removed. Thus, a critical balance of properties is required to achieve the necessary performance.

Several materials were evaluated for the porous film. One of the material that has shown the best performance, to be the porous film, to date was porous ultra high molecular weigh polyethylene (UHMWPE). Porous UHMWPE is available with a wide range of pore volumes and pore sizes. Other materials have also been evaluated and shown to work at various levels of success. These include, but are not limited to, various type of cellulose based paper, porous fluoropolymers, synthetic paper (non-cellulose based) and several types of filter media. The key requirements are proper pore structure and proper wetting behavior.

Figure 5:
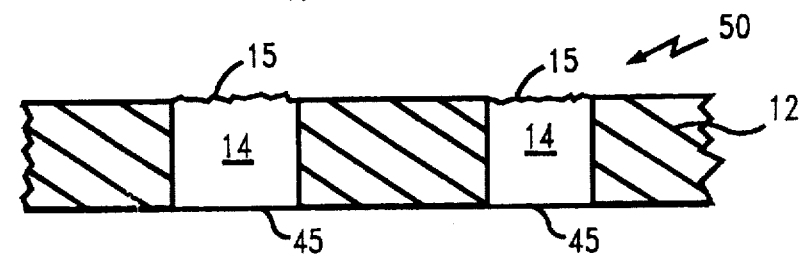
FIG. 5, is a side view of the filled green sheet after the inventive backing layer has been removed.

As illustrated in FIG. 5, that once the metallic paste 14 has fully dried, the porous backing film 20, can be simply removed which results in a green ceramic layer 50, having a ceramic layer 12, with at least one via 14. Wherein the surface of the via 14, may have a flush, pit and depression free via surface 15, at the upper surface 13, and has a smooth, flush, pit and depression free surface 45, at the lower surface 17. It should be noted that the smooth surface 45, basically is due to the presence of the backing layer 20, that had absorbed any excess fluids during the drying process.

The backing film should be selected to be sufficiently resistant to screening and/or drying temperature and pressure conditions, and also remain adhered to the ceramic green sheet. The backing film should also be removable from the green ceramic sheet after screening without causing any damage to the screened green sheet.

For most applications it is preferred that the green sheet is a ceramic green sheet. However, the green sheet could be selected from a group comprising aluminum nitride, aluminum oxide, glass-ceramic, to name a few.

The adhesive force between the green sheet and the backing layer should be very good to prevent any movement of the green sheet relative to the backing film. Thus maintaining a very good interface between the green sheet and the backing layer is very important. The elimination of the movement at the interface of the backing material and the green sheet is very critical for the production of the pit-free vias. Therefore, there must be no movement between the two layers.

It should be understood that the porosity of the backing layer or material is very important, because the porosity is serving to extract paste solvents out of the paste during the drying of the paste cycle. Similarly, the structure of the pores is also very critical, since capillary pressure controls the process. Also, wetting behavior of the paste solvents are equally critical for the liquid phase wetting.

The pores of the backing layer should be small enough to absorb the paste solvents but not too big to absorb portions of the metallic screening paste. Therefore, the porosity of the porous backing layer should be between about 0.01 and about 100.00 microns, and preferably between about 0.10 and about 10.00 microns, and more preferably between about 0.20 and about 5.00 microns.

It is preferred that the backing film or layer has a pore size of between about 1 to about 2 microns, and preferably a pore volume of between about 60 to about 90 percent.

EXAMPLE

The following example is intended to further illustrate the invention and is not intended to limit the scope of the invention in any manner.

EXAMPLE 1

To demonstrate the effectiveness of this process, numerous studies have been conducted. It was seen that the green sheets that were processed without the porous backing film had pits levels that were around 88 percent. However, for green sheets that were processed using the inventive porous backing film the pit levels dropped to less than 1 percent.

The porous backing film that was used for these experiments is sold by the tradename of SOLUPOR. SOLUPOR is a porous UHMW polyethylene film, having a pore size of between about 0.1 to about 2.0 microns, and had a pore volume of between about 60 percent to about 90 percent.

These values were typical and apply only to the controlled experiments run for the evaluations. Actual ranges will depend on numerous processing variables and as such, these data should be used only for comparison purposes.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for screening a green sheet using at least one porous backing layer, comprising the steps of:
   (a) placing a green sheet with at least one hole on said at least one porous backing layer, such that said backing layer entirely covers said at least one hole and forms a bi-layer, and wherein the Porosity of said at least one porous backing layer is between about 0.01 and about 100.00 microns,
   (b) screening said bi-layer with at least one metallic paste comprisi metallic material and fluids, such that said metallic paste fills said at least one hole in said green sheet,
   (c) placing said bi-layer in a paste drying environment, wherein said porous backing layer has a pore structure and surface chemistry to extract said fluids present in said metallic paste by capillary action, and wherein said capillary action results in an adhesion between said metallic paste and said porous backing layer to form a flush surface for said metallic material in said hole in said green sheet during drying, and
   (d) removing said pous backing layer from said green sheet such that the exposed surface of said metallic material present in said hole is flushed with the surface of said green sheet and wherein said exposed surface of said metallic material is depression free, and thereby completing the screening of a green sheet using at least one porous backing layer.

2. The process of claim 1, wherein said green sheet is selected from the group consisting of aluminum nitride, aluminum oxide, ceramic and glass-ceramic.

3. The process of claim 1, wherein said backing layer material is selected from the group consisting of latex, poly(aikenes), polyester, polymeric material, polyimide and rubber.

4. The process of claim 1, wherein said backing layer material is selected from the group consisting of cellulose based paper, porous fluoropolymers and synthetic non-cellulose based paper.

5. The process of claim 1, wherein said backing layer has a pore size of between about 1 to about 2 microns and a pore volume of between about 60 to about 90 percent.

6. The process of claim 1, wherein said backing layer has a pore volume of between about 60 to about 90 percent.

7. The process of claim 1, wherein said screening paste is selected from the group consisting of copper, gold, molybdenum, nickel, platinum, silver, tungsten and alloys thereof.

8. The process of claim 1, wherein the surface of said dried metallic paste is flush smooth with the surface of said green sheet.

9. A bi-layer green sheet structure, comprising,
   (a) at least one green sheet with at least one via hole,
   (b) at least one porous backing layer supporting said at least one green sheet, such that said at least one via hole is entirely covered by said at least one porous backing layer, and wherein the Dorosity of said at least one porous backing layer is between about 0.01 and about 100.00 microns, and
   (c) metallic paste comprising metallic material and fluids, wherein upon screening said green sheet with said metallic paste, said metallic paste makes direct contact with the portion of said backing layer covering said via hole, wherein said porous backing layer has a pore structure and surface chemistry to extract said fluids by capillary action, and wherein said capillary action results in an adhesion between said metallic paste and said porous backing layer to form a flush surface for said metallic material present in said hole in said green sheet during drying, and whereupon removing said porous backing layer from said green sheet results in the exposed surface of said metallic material present in said hole to be flushed with the surface of said green sheet and wherein said exposed surface of said metallic material is depression free.

10. The structure of claim 9, wherein said green sheet is selected from the group consisting of aluminum nitride, aluminum oxide, cermic and glass-ceramic.

11. The structure of claim 9, wherein said backing layer material is selected from the group consisting of latex, poly(alkenes), polyester, polymeric material, polyimide and rubber.

12. The structure of claim 9, wherein said backing layer material is selected from the group consisting of cellulose based paper, porous fluoropolymers and synthetic non-cellulose based paper.

13. The structure of claim 9, wherein said backing layer has a pore size of between about 1 to about 2 microns and a pore volume of between about 60 to about 90 percent.

14. The structure of claim 9, wherein said backing layer has a pore volume of between about 60 to about 90 percent.

15. The structure of claim 9, wherein said screening paste is selected from the group consisting of copper, gold, molybdenum, nickel, platinum, silver, tungsten and alloys thereof.

16. The structure of claim 9, wherein the porosity of said at least one porous backing layer is between about 0.10 and about 10.00 microns.

17. The structure of claim 9, wherein the porosity of said at least one porous backing layer is between about 0.20 and about 5.00 microns.

18. The process of claim 1, wherein the porosity of said at least one porous backing layer is between about 0.10 and about 10.00 microns.

19. The process of claim 1, wherein the porosity of said at least one porous backing layer is between about 0.20 and about 5.00 microns.

* * * * *